United States Patent [19]

Lim et al.

[11] Patent Number: 5,773,878
[45] Date of Patent: Jun. 30, 1998

[54] IC PACKAGING LEAD FRAME FOR REDUCING CHIP STRESS AND DEFORMATION

[75] Inventors: Thiam Beng Lim, Toh Crescent; Sarvotham M. Bhandarkar, Telok Kurau, both of Singapore

[73] Assignee: Institute of Microelectronics National University of Singapore, Singapore, Singapore

[21] Appl. No.: 582,643

[22] Filed: Jan. 4, 1996

[30] Foreign Application Priority Data

Oct. 28, 1995 [SG] Singapore ............................ 9501670-5

[51] Int. Cl.[6] .................................................. H01L 23/495
[52] U.S. Cl. ........................................... 257/676; 257/669
[58] Field of Search ..................................... 257/676, 669

[56] References Cited

U.S. PATENT DOCUMENTS 5,637,917  6/1997  Tomita et al. .......................... 257/676
5,661,338  8/1997  Yoo et al. .............................. 257/676

FOREIGN PATENT DOCUMENTS 4-22162   2/1992  Japan ..................................... 257/676
4186666   7/1992  Japan ..................................... 257/676
6236959   8/1994  Japan ..................................... 257/676

Primary Examiner—T. M. Arroyo
Attorney, Agent, or Firm—Meltzer, Lippe, Goldstein, et al.

[57] ABSTRACT

The present invention relates to a lead frame design for IC packaging to reduce chip stress and deformation and to improve mold filling. The die-pad is split into several sections which are jointed together by flexible expansion joints. The split die-pad allows relative motion between the pad and the chip during die attach cure. It also breaks down the total die pad area (and length) that is rigidly attached to the chip into smaller sections. These two factors reduce the magnitude of coefficient-of-thermal expansion (CTE) mismatch and out of plane deformation of the assembly, resulting in lower chip stress and deformation and improved package moldability.

14 Claims, 4 Drawing Sheets

IC PACKAGING LEAD FRAME FOR REDUCING CHIP STRESS AND DEFORMATION

FIELD OF THE INVENTION

The present invention relates to a lead frame design for IC packaging to reduce chip stress and deformation and to improve mold filling. The die-pad is split into several sections which are joined together by flexible expansion joints. The split die-pad allows relative motion between the pad and the chip during die attach cure. This also breaks down the total die pad area (and length) that is rigidly attached to the chip into smaller sections. These two factors reduce the magnitude of coefficient-of-thermal expansion (CTE) mismatch and out of plane deformation of the assembly, resulting in lower chip stress and deformation and improved package moldability.

BACKGROUND OF THE INVENTION

A conventional package for a semiconductor chip is provided with a lead frame. The lead frame is a unitary structure which comprises a plurality of leads and a die pad onto which the semiconductor chip (also known as the "die") is mounted. The lead frame as well as the chip are encapsulated in a molding compound.

A conventional lead frame is illustrated in FIG. 1. FIG. 1 shows a top planar view of the lead frame. The lead frame 100 of FIGS. 1 is of unitary construction and comprises a die pad 14. The die pad 14 is a flat planar area on which the semiconductor chip is eventually mounted (see FIG. 2). It is a particular disadvantage of the conventional lead frame that the die pad 14 is a single continuous planar area. The reason for this disadvantage will be discussed below. The die pad 14 is illustratively 14 mm by 14 mm with a thickness of 0.2 mm.

The lead frame 100 also comprises a plurality of inner leads 16a and a plurality of outer leads 16b, each outer lead 16b being connected to one inner lead 16a. (As can be seen in FIG. 2, typically the inner leads 16a are located in a plane which is above the plane of the die pad 14 and the outer leads 16b are located in a plane which is below the plane of the die pad 14, in the final packaged IC.)

The lead frame 100 also comprises right and left outer frame portions 15 and upper and lower outer frame portions 17 which are continuous to the right and left outer frame portions 15 and intersect them orthogonally. The die pad suspension straps 19 connect the die pad 14 to the unitary frame formed by the right and left and upper and lower frame portions 15, 17.

Dam bars 25 are provided to dam the flow of mold compound to prevent leakage from the mold cavity during encapsulation and also to support the outer lead portions 16b. The slits 27 are provided to relieve stresses during an encapsulation step (to be discussed below) which takes place at an elevated temperature.

The lead frame 100 of FIG. 1 is formed as one unit which is part of a strip. Adjacent lead frame units in the strip have continuous upper and lower frame portions 17. The openings 28/30 are provided for transportation or positioning in the longitudinal direction of the strip during the automated assembly of a semiconductor chip package.

Illustratively, the lead frame 100 is made of a precipitation hardening copper material which contains 0.05–0.15% zirconium. (The balance being copper). This material has a high electric conductivity as well as a high tensile strength and is especially suitable for the attachment of bonding wires (to be discussed below).

FIG. 2 schematically illustrates a semiconductor chip package 10 formed using the lead frame 100 of FIG. 1. The IC package 10 comprises the lead frame 100 of FIG. 1. As discussed above, the lead frame 100 includes the die pad 14, the inner leads 16a and the outer leads 16b. The IC semiconductor chip (die) 20 is attached to the top of the die pad 14 by means of die attach adhesive 18. The process of die attach takes place at 160° C.

The inner leads 16a of the lead frame 100 are then bonded to bond pads (not shown) on the chip 20 using bonding wires 22. The bonding wires are attached as follows: A ball is formed at one end of a bonding wire 22 which is typically made of gold or aluminum. This ball is then attached by thermocompression jointly employing ultrasonic vibrations to a bonding pad on the chip. A similar process is used to attach the bonding wire to the inner lead 16b. This process is done at 260° C.

The entire assembly is then encapsulated (molded) using a thermoset compound 24. This compound may be a low temperature hardening resin which is hardened at a typical temperature of approximately 160° C. for about 1–3 minutes. Upper and lower mold cavities (not shown) are used to contain the resin as it hardens. The molded packages are then subjected to a curing process at elevated temperatures typically of the order of 170° C. for several hours in order for the thermoset compound to complete the cross-linking of the polymeric chains.

The next step (trim and form operation) is to trim the lead frame 100 by removing the left and right frame portions 15, the upper and lower frame portions 17, and the dam bars 25. The result is the resin encapsulated semiconductor device package 10 of FIG. 2.

The packaged semiconductor device 10 may then be mounted on a printed circuit board (not shown) by connecting the outer leads 16b to the printed circuit board using a vapor-phase reflow process. In the vapor phase reflow process, a solder is deposited on both the printed circuit board and the outer lead portions 16b of the package 10. A heat treatment is carried out to use the solder to attach the package to the printed circuit board.

A number of problems may arise in connection with the process for forming the semiconductor device package 10. One problem is that moisture may adhere to the lead frame 100 and/or be absorbed within the molding compound during a storage interval prior to attachment of the chip package to a printed circuit board. This moisture has a tendency to concentrate at the interface between the underside of the die pad and the molding compound and vaporize during the vapor-phase reflow process. The pressure of this water vapor tends to cause the die pad to separate from the molding compound and to form cracks in the molding compound. Solutions to this problem are disclosed in U.S. Pat. No. 5,182,630, U.S. Pat. No. 4,942,452, and U.S. Pat. No. 5,150,193, the contents of which are incorporated herein by reference. The solutions all involve providing openings in the die pad to improve its adhesion to the mold compound.

Another problem which arises during the production of the semiconductor chip package 10 of FIG. 2 is as follows. The materials which constitute the package 10 have differing coefficients of thermal expansion (CTE) commonly referred to as CTE mismatch or thermal mismatch. The lead frame 100, as mentioned above, is formed from copper, which has a CTE of $17 \times 10^{-6}$/°C. The chip 20 is formed of silicon and has a CTE of $2.6 \times 10^{-6}$/°C. This CTE mismatch results in out-of-plane deformation of the chip and die pad assembly when it is exposed to elevated processing temperatures, such as during the die attach process and during wire bonding. The term "out-of-plane" refers to the direction perpendicular to the plane of the die pad. The deformation is shown in FIGS. 3A, 3B and 3C. FIG. 3A shows a non-deformed assembly. FIG. 3B shows the deformation at room temperature after die attach cure. FIG. 3C shows the deformation during wire bonding.

The deformation results in stresses in the chip which increase in direct proportion to the magnitude of the deformation. For large chip sizes, the stress in the chip is sometimes so severe that subsequent processing involving application of pressure/force (e.g., trim and form operation) or temperature changes in application result in cracking of the chip. Additionally, these stresses may degrade the electrical performance of the chip even though physical fracture has not taken place. In some cases microcracks in the silicon are initiated immediately after die attach cure and in the worst case the entire chip fractures.

The deformation also causes the intended position of the chip and lead frame assembly within the upper and lower mold cavities to be altered as shown in FIGS. 4A and 4B. As a result, the molding material flow in the top and bottom mold cavities becomes unbalanced. Specifically, in the case of a non-deformed package, as shown in FIG. 4A, the distance x (from the top of the chip 20 to the top of the molding material 24) is approximately equal to the distance y (from the bottom of the die pad 14 to the bottom of the molding material 24.) In the case of a deformed package, as shown in FIG. 4B, the distance x does not equal the distance y. When the distances x and y are greatly different, the flow of the mold compound during the encapsulation process is not balanced, i.e., the flow in x may be faster than that in y or vice versa. As a result, the faster flowing section will tend to block the evacuation of air from the cavity and this causes undesirable voids in the finished package. Thin packages (approximately 1 mm or less in thickness) are especially susceptible to this defect. Tilting of the die pad caused by the unbalanced flow of the molding compound further aggravates the problem.

In view of the foregoing, it is an object of the invention to provide a lead frame which overcomes the semiconductor packaging problems discussed above.

Specifically, it is an object of the invention to provide a lead frame which overcomes the problems resulting from a difference in coefficient of thermal expansion in the materials used to form a semiconductor chip package.

SUMMARY OF THE INVENTION

The invention is a new lead frame design which will reduce the out-of-plane deformation of the chip and die-pad assembly. Thermal deformation is reduced, as is the stress in the chip, and moldability of the lead frame-chip assembly is improved.

As opposed to the conventional single-piece die-pad, the new design utilizes a split die-pad. The die-pad is split into two or more sections which are connected to each other by flexible expansion joints. The chip is attached to the smaller die-pad sections, but not to the expansion joints. This allows sliding in-plane motion between the segmented die-pad and chip due to the difference in the coefficient of thermal expansion at elevated temperatures such as during the die attach cure and wire bonding processes. The sliding motion takes place through expansion or contraction of the expansion joints, which are not rigidly attached to the chip. The sliding motion alleviates the build-up of stress in the chip/die pad assembly. The smaller die-pad sections also break down the total length (and area) of the pad that is rigidly attached to the chip. The maximum continuous length and area that is available for thermal expansion mismatch is therefore reduced.

These two factors tend to reduce the out-of-plane deformation of the leadframe assembly during the various assembly processes. The reduction in out-of-plane deformation is beneficial because it proportionately decreases the stress in the chip thereby improving the reliability of the package. It also leads to balanced flow in the molding cavities, thereby reducing the possibility of voids in the molded package.

DETAILED DESCRIPTION OF THE INVENTION

Figure 5A:
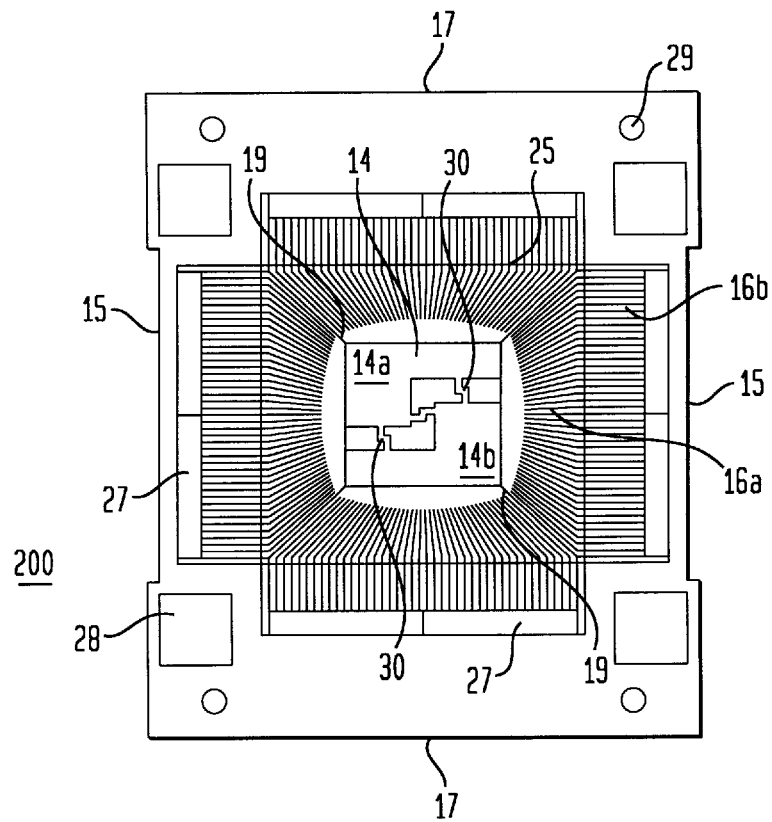
FIGS. 5A, 5B and 5C schematically illustrate lead frames in which the die pad is divided into sections according to the invention.

A lead frame according to an illustrative embodiment of the invention is shown in FIG. 5A.

Figure 1:
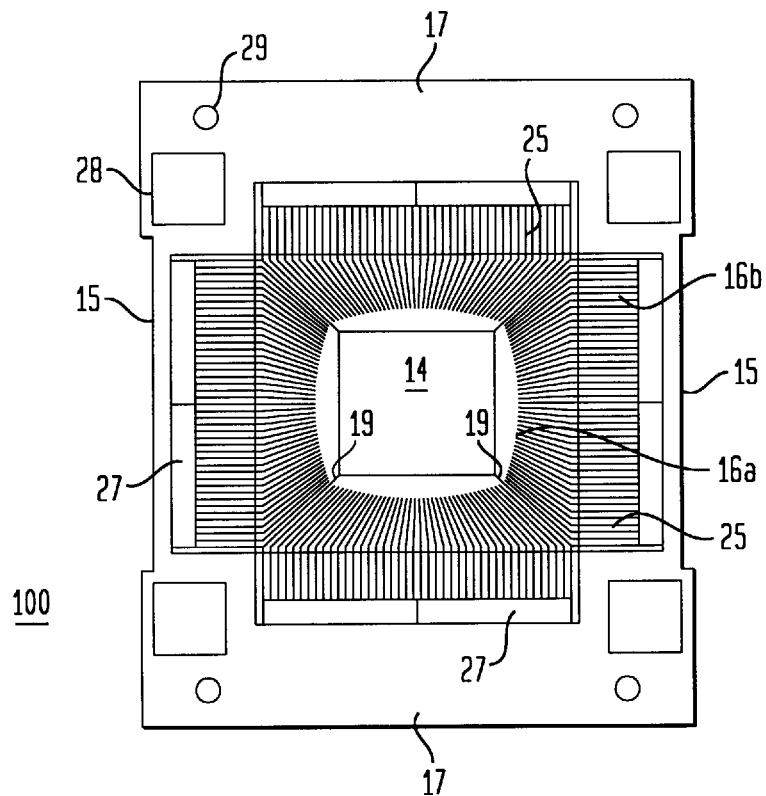
FIG. 1 is a planar view of a conventional lead frame in which the die pad is formed as a single unitary area.
Figure 2:
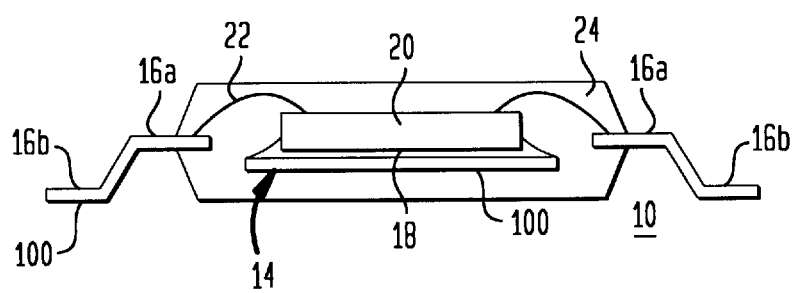
FIG. 2 schematically illustrates a chip package formed using the lead frame of FIG. 1.
Figure 3A:
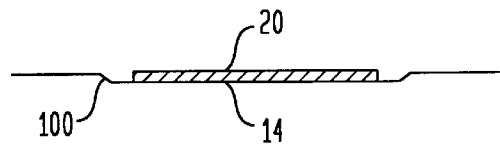
FIGS. 3A, 3B, and 3C illustrate the deformation of the conventional die pad/chip assembly during formation of a package because of CTE mismatch.
Figure 3B:
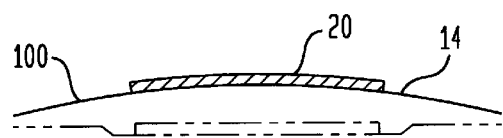
Figure 3C:
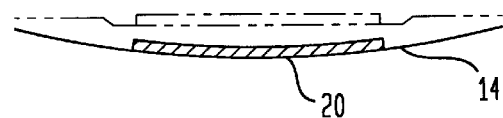
Figure 4A:
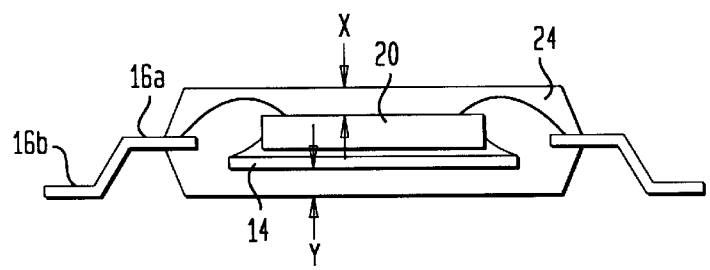
FIGS. 4A and 4B illustrate how the position of the die pad and chip in a package is altered because of the deformation resulting from CTE mismatch.
Figure 4B:
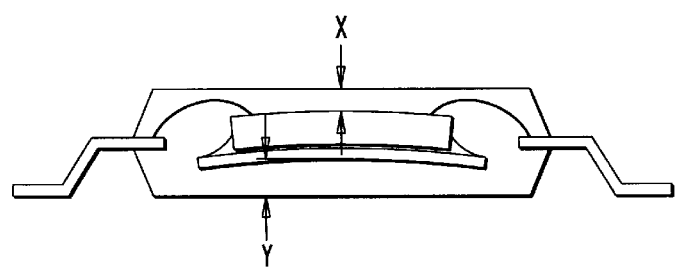

Like the lead frame 100 of FIG. 1, the inventive lead frame 200 of FIG. 5A, is a single integral unit which comprises a die pad 14, inner lead portions 16a, outer lead portions 16b, and dam bars 25. The right and left frame portions 15 and the upper and lower frame portions 17 form a unitary frame structure. The slits 27 are provided to relieve stress. The openings 28/29 are provided for transportation and positioning of a strip comprising a plurality of lead frames having contiguous upper and lower lead frame portions.

In contrast to the conventional lead frame 100 of FIG. 1, wherein the die pad 14 forms a single contiguous solid area, the die pad 14 of the lead frame 200 of FIG. 5A comprises a plurality of sections 14a, 14b. The sections 14a, 14b are connected by flexible expansion joints 30.

The die pad sections 14a and 14b are connected to the unitary lead frame structure, formed by the upper and lower and right and left frame portions 15, 17, by the die pad suspension straps 19.

In the embodiment of the invention shown in FIG. 5A, the die pad sections 14a, 14b are "L-shaped" sections which face one another.

Figure 5B:
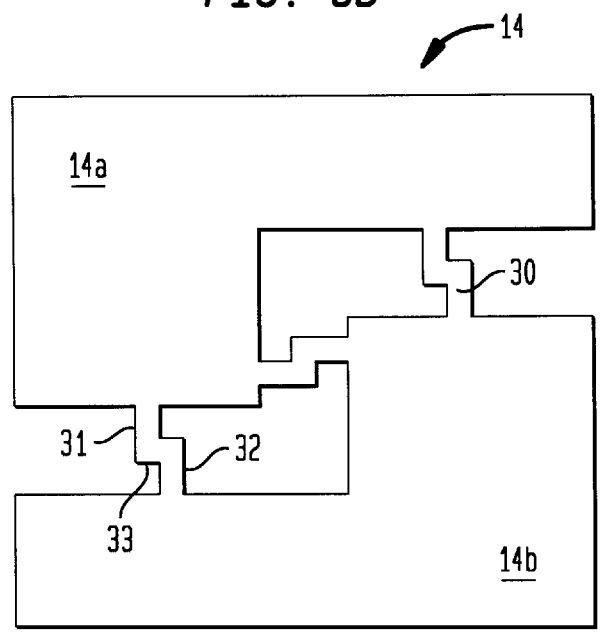

The L-shaped sections 14a, 14b and expansion joints 30 are shown in greater detail in FIG. 5B. The expansion joints 30 are strips. Illustratively, these strips are about 1.6 mm long. Each expansion joint strip is divided into three sections. A first strip section 31 is integral with die pad section 14a, a second strip section 32 is integral with die pad section 14b. A third strip section 33 is orthogonal to and connects with the strip sections 31 and 32.

Figure 5C:
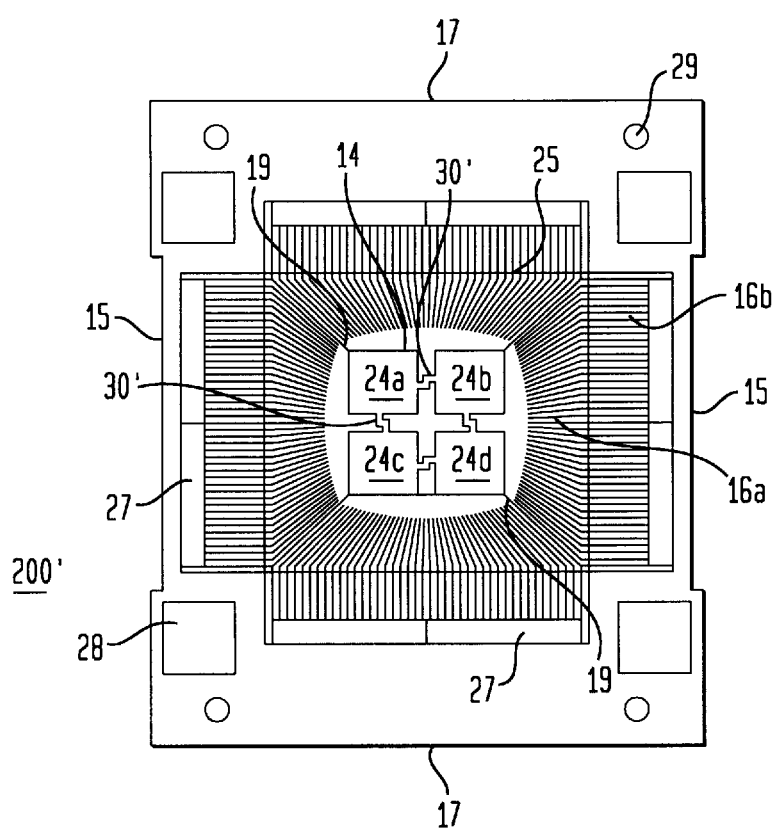

An alternative embodiment of the invention is shown in FIG. 5C. In FIG. 5C, the lead frame 200' is illustrated. In the lead frame 200', the die pad is separated into four square sections 24a, 24b, 24c, 24d. Each of the square sections has an edge length which is about 3.5 mm. The square sections 24a, 24b, 24c, 24d are connected to each other by the expansion joints 30' which are in the form of strips. Illustratively, these strips are 1.6 mm long. The strips which make up the expansion joints 30' are divided into three sections (like the expansion joints 30 of FIGS. 5A and 5B).

In accordance with the invention, an IC package is made according to the following steps.

1. The die is attached to the die pad sections using die attach. This process takes place at 160° C. However, no die attach is applied to the expansion joints. Thus, the expansion joints are not rigidly attached to the die.

This permits relative sliding motion between the die and the die pad to take place during the subsequent processing steps at elevated temperatures. The sliding motion is caused by expansion and contraction of the expansion joints.

2. A wire bonding process takes place (as described above at 260° C.) for attaching bonding wires to the chip and to the leads of the lead frame.
3. An encapsulation process takes places (as described above) whereby the die and lead frame are encapsulated in a molding compound.
4. A trim and form operation is used to remove the upper and lower and left and right outer frame portions of the lead frame and the tie bars.

The improvement achieved through use of the inventive lead frame is significant. The improvement is summarized by the following table which compares the solid die pad of FIG. 1 with the die pad of FIG. 5C.

| Die Pad Design | Chip and Die Pad Warpage (mm) | | Chip Stress (MPa) | |
| --- | --- | --- | --- | --- |
| | After Die Attach (160° C.) | After Wire Bonding (260°) | After Die Attach (160° C.) | After Wire Bonding (260°) |
| Solid Die Pad (shown in FIG. 1) | 0.0705 | 0.1312 | 65.1 | 121.1 |
| Die Pad Divided Into Four Square Sections (shown in FIG. 5C) | 0.0512 | 0.0637 | 47.3 | 58.8 |
| % Improvement | 27.38% | 51.45% | 27.38% | 51.45% |

Significant improvements are achieved using the die pad of FIG. 5A as well. Note that warpage is a measure of the deformation of the chip and die pad assembly in a direction perpendicular to the plane of the die pad. The split die pad of FIG. 5C results in a 27% improvement in warpage after die attach and 51% improvement in warpage after die attach and wire bonding. The warpage was measured using optical methods. The chip stress is determined from the warpage using the Euler beam bending formula.

It is also seen from the table that the wire bonding process causes additional deformation of the chip and die-pad assembly over and above that caused by the die-attach process. This is in spite of the fact that the attach material is almost completely cured during the die-attach process. The reason for the deformation is attributable to the viscoelastic nature of the die-attach which results in higher stress after subsequent thermal processes at temperatures higher than the die-attach cure temperature. For the solid pad design, the wire bonding process results in an 86% increase in deformation, while for the split die pad of this invention, the increase is only 24% indicating that the latter design is superior in negating the detrimental effect of the die-attach material.

In short, a novel lead frame for use in a semiconductor chip package has been disclosed. Finally, the above described embodiments of the invention are intended to be illustrative only. Numerous alternative embodiments may be devised by those skilled in the art without departing from the spirit and scope of the following claims.

We claim:

1. A lead frame for a semiconductor die having a unitary construction, comprising:
    a die pad configured to receive the semiconductor die;
    a frame surrounding said die pad and connected to said die pad by at least one die pad suspension strap; and
    a plurality of leads connected to the semiconductor die; said leads being formed integrally with said frame;
    wherein said die pad is divided into a plurality of sections, adjacent ones of the sections being connected by at least one flexible expansion joint.

2. The lead frame of claim 1, wherein said expansion joint is formed integrally with said die pad sections.

3. The lead frame of claim 1, wherein said die pad has a square shape and said square shaped die pad is divided into four square shaped sections, adjacent ones of the square shaped sections being connected by an expansion joint.

4. The lead frame of claim 1, wherein said die pad comprises two L-shaped sections connected by said at least one expansion joint.

5. The lead frame of claim 2, wherein each expansion joint comprises a first strip section connected to first die pad section, a second strip section connected to a second die pad section, said first and second strip sections being parallel, and a third strip section substantially orthogonal to said first and second strip sections and connecting said first and second strip sections.

6. The lead frame of claim 1, wherein the at least one expansion joint is configured to allow relative motion between the die pad and the semiconductor die.

7. A semiconductor chip package, comprising:
    a die pad divided into a plurality of die pad sections interconnected by at least one flexible expansion joint;
    a semiconductor die adhered to said die pad by an adhesive which is applied to said die pad sections but not to said at least one flexible expansion joint;
    a plurality of leads connected by bonding wires to said die; and
    encapsulation material surrounding said die pad, said die, said leads, and said bonding wires.

8. The package of claim 7, wherein said at least one expansion joint comprises a strip which is formed integrally with first and second die pad sections.

9. The semiconductor chip package of claim 7, where the at least one expansion joint is configured to allow relative motion between the die pad and the semiconductor chip.

10. The semiconductor chip package of claim 7, wherein the at least one expansion joint comprises a first portion connected to a first die pad section; a second portion connected to a second die pad portion and being parallel to the first portion; and a third portion connected to and substantially orthogonal to the first and second sections.

11. A lead frame and semiconductor chip assembly, comprising:

a lead frame comprising a die pad and leads, said die pad comprising at least two sections interconnected by a flexible expansion joint; and a semiconductor chip which is attached to said die pad by an adhesive which is applied to said die pad sections but not said expansion joint;

said die pad and said chip configured for sliding motion relative to one another due to expansion and contraction of said expansion joint when subjected to temperature change.

12. The assembly of claim 11, wherein said expansion joint comprises a strip formed integrally with said die pad sections.

13. The assembly of claim 11, further comprising bonding wires for connecting said leads to said chip and encapsulation material for encapsulating said die pad, chip, leads, and bonding wires.

14. The lead frame and semiconductor chip assembly of claim 11, wherein the expansion joint comprises a first portion connected to a first die pad section; a second portion connected to a second die pad portion and being parallel to the first portion; and a third portion connected to and substantially orthogonal to the first and second sections.

\* \* \* \* \*